United States Patent
Ben Mohamed et al.

(10) Patent No.: US 9,425,081 B2
(45) Date of Patent: Aug. 23, 2016

(54) METHOD OF IMPLANTATION FOR FRAGILIZATION OF SUBSTRATES

(71) Applicant: Soitec, Crolles Cedex (FR)

(72) Inventors: Nadia Ben Mohamed, Renage (FR); Carole David, Crolles (FR); Camille Rigal, Marseille (FR)

(73) Assignee: SOITEC, Barnin (FR)

( * ) Notice: Subject to any disclaimer, the term of this patent is extended or adjusted under 35 U.S.C. 154(b) by 0 days.

(21) Appl. No.: 14/386,937

(22) PCT Filed: Mar. 14, 2013

(86) PCT No.: PCT/IB2013/000412
§ 371 (c)(1),
(2) Date: Sep. 22, 2014

(87) PCT Pub. No.: WO2013/140223
PCT Pub. Date: Sep. 26, 2013

(65) Prior Publication Data
US 2015/0050797 A1     Feb. 19, 2015

(30) Foreign Application Priority Data
Mar. 23, 2012   (FR) .................... 12 52613

(51) Int. Cl.
*H01L 21/762*     (2006.01)
*H01L 21/20*      (2006.01)
(Continued)

(52) U.S. Cl.
CPC ....... *H01L 21/76254* (2013.01); *H01L 21/187* (2013.01); *H01L 21/2007* (2013.01);
(Continued)

(58) Field of Classification Search
CPC .................. H01L 21/26586; H01L 21/76254; H01L 21/26506; H01L 21/2007; H01L 21/76251; H01L 21/76259; H01L 21/187
See application file for complete search history.

(56) References Cited

U.S. PATENT DOCUMENTS

| 6,806,479 B1 | 10/2004 | Wan et al. |
| 2003/0153162 A1 | 8/2003 | Nakano et al. |

(Continued)

FOREIGN PATENT DOCUMENTS

| EP | 2320454 A1 | 5/2011 |
| FR | 2847075 A1 | 5/2004 |

OTHER PUBLICATIONS

Agarwal et al., "Efficient production of silicon-on-insulator films by co-implantation of He+ with H+," Applied Physics Letters, vol. 72, No. 9, (1998), 1086-1088.

(Continued)

*Primary Examiner* — Thanhha Pham
(74) *Attorney, Agent, or Firm* — TraskBritt

(57) ABSTRACT

The disclosure relates to a method for implantation of atomic or ionic species into a batch of substrates made of semiconductor material, in which: each substrate made of semiconductor material is positioned on a respective support of a batch implanter, each substrate comprising a thin layer of electrical insulator on its surface; and a dose of at least one ionic or atomic species is implanted over the whole surface of the substrates, through their layer of insulator, so as to form a fragilization region within each substrate and to bound there a thin layer of semiconductor material between the thin layer of insulator and the fragilization region of the substrate, the implantation method being characterized in that, during the method, each support on which a substrate is positioned has at least two separate inclinations with respect to the plane orthogonal to the direction of implantation of the species in order to improve the implantation depth of the species in the substrate. The disclosure also relates to structures of the semiconductor-on-insulator type obtained by the implementation of the implantation method.

13 Claims, 4 Drawing Sheets

(51) Int. Cl.
*H01L 21/18* (2006.01)
*H01L 21/265* (2006.01)

(52) U.S. Cl.
CPC ... *H01L21/26506* (2013.01); *H01L 21/26586* (2013.01); *H01L 21/76251* (2013.01); *H01L 21/76259* (2013.01)

(56) References Cited

U.S. PATENT DOCUMENTS

2005/0148163 A1* 7/2005 Nguyen ............ H01L 21/76254
438/514
2011/0244653 A1 10/2011 Sekiguchi
2012/0043712 A1 2/2012 Weaver et al.
2013/0071997 A1 3/2013 Delprat et al.

OTHER PUBLICATIONS

International Search Report for International Application No. PCT/IB2013/00412 dated Jun. 28, 2013, 4 pages.
International Written Opinion for International Application No. PCT/IB2013/00412 mailed Jun. 28, 2013, 6 pages.
International Preliminary Report on Patentability for International Application No. PCT/IB2013/00412 dated Sep. 23, 2014, 7 pages.

* cited by examiner

METHOD OF IMPLANTATION FOR FRAGILIZATION OF SUBSTRATES

CROSS-REFERENCE TO RELATED APPLICATIONS

This application is a national phase entry under 35 U.S.C. §371 of International Patent Application PCT/IB2013/000412, filed Mar. 14, 2013, designating the United States of America and published in English as International Patent Publication WO 2013/140223 A1 on Sep. 26, 2013, which claims the benefit under Article 8 of the Patent Cooperation Treaty and under 35 U.S.C. §119(e) to French Patent Application Serial No. 1252613, filed Mar. 23, 2012, the disclosure of each of which is hereby incorporated herein in its entirety by this reference.

TECHNICAL FIELD

This disclosure relates to the implantation of semiconductor structures by means of one or more ionic or atomic species, in order to form a region of fragilization within such structures, with a view to the detachment of a thin layer bounded by the fragilization region.

The disclosure may notably be applied to the fabrication of structures of the semiconductor-on-insulator type, also referred to by the acronym "SOI," in which a layer of insulator is sandwiched between a thin layer of semiconductor material and a base substrate.

The term "insulator" is understood to refer to an electrical insulator.

BACKGROUND

A structure of the SOI type generally comprises at least one layer of insulator sandwiched between a thin upper layer and a base substrate, typically composed of silicon. "Thin layer" is taken to be a layer with a thickness typically in the range between 50 Å and a few micrometers, for example, around a hundred Angstroms, for example, 120 Å.

The layer of insulator can be a layer of oxide, such as $SiO_2$, which is then referred to by the acronym "BOX," for "buried oxide," in other words oxide buried under the thin layer of silicon.

The fabrication of structures of the SOI type generally comprises the following steps:
  formation of a layer of oxide on the surface of a substrate made of a semiconductor material such as silicon;
  implantation of atomic or ionic species into the substrate, through the layer of oxide, so as to form a fragilization region within the substrate, and to bound a thin layer of semiconductor material between the layer of oxide and the fragilization region;
  bonding of the substrate onto a second substrate; and
  removal of the back part of the first substrate, by detachment along the fragilization region, so as to conserve only the structure of the SOI type.

It is also possible to carry out the implantation of the atomic or ionic species into the substrate and to form the layer of insulator on the second substrate.

Nevertheless, implanting the species through the insulator offers certain advantages. This allows the implantation depth of the species to be made uniform, by notably reducing a phenomenon known as "channeling," during which the implanted species along a main direction of the crystal lattice formed by the thin layer propagate to a greater depth than the mean depth reached by the implanted species.

Furthermore, as indicated hereinabove, the fragilization region defined by the implanted species bounds the thin layer to be detached from the substrate. Making the implantation depth of the species uniform, therefore, allows the thickness of the thin layer to be made more uniform, this thickness being subject to very tight controls because it strongly influences the quality of the SOI structure obtained.

However, in the latest SOI structures developed, called "UTBOX" for Ultra-Thin Buried Oxide, in which the thickness of the layer of oxide is less than around 50 nm (such a layer will be referred to as "thin oxide film"), the inventors have observed that the thickness uniformity of implantation of the species is degraded when the implanter used is of the batch implanter type.

In this type of implanter, a plurality of substrates to be implanted are positioned on as many supports disposed around a perimeter of a wheel rotating about its axis of symmetry, and exposed, in turn, to a flux of species maintained in a constant direction.

Surprisingly, the use of a batch implanter for implanting an UTBOX structure does not allow satisfactory results in terms of implantation depth to be obtained. Furthermore, in the case of an SOI structure of the UTBOX type, the specifications on the thickness uniformity of the thin layer of semiconductor material to be detached from the substrate are even more severe than for conventional SOI structures.

It is, therefore, necessary to develop, notably for SOI structures of the UTBOX type, novel solutions to allow an improved uniformity of the implantation depth of the ionic or atomic species in the substrate.

BRIEF SUMMARY

The object of this disclosure is to overcome the aforementioned problem. In particular, one of the aims of this disclosure is to provide a novel method for implantation of atomic or ionic species into a substrate through a thin layer of insulator, and allowing a uniform implantation depth of the species to be obtained.

For this purpose, the disclosure provides a method for implantation of atomic or ionic species into a batch of substrates made of semiconductor material, in which:
  each substrate made of semiconductor material is positioned on a respective support of a batch implanter, each substrate comprising a thin layer of electrical insulator on its surface; and
  a dose of at least one ionic or atomic species is implanted over the whole surface of the substrates, through their layer of insulator, so as to form a fragilization region within each substrate and to bound there a thin layer of semiconductor material between the thin layer of insulator and the fragilization region of the substrate;
  the implantation method being characterized in that, during the method, each support on which a substrate is positioned has at least two separate inclinations with respect to the plane orthogonal to the direction of implantation of the species, in order to make the implantation depth of the species in the substrate uniform.

Advantageously, but optionally, this disclosure furthermore comprises at least one of the following features:
  the inclinations of the support have an angle in the range between 2° and 15°, preferably between 4° and 10° with respect to the plane orthogonal to the direction of implantation;
  during the implantation step, a predetermined dose of atomic species is implanted, the implantation comprising the implantation of a first part of the dose while the support presents a first inclination, and of a second part of the dose while the support presents a second inclination;

the first inclination and the second inclination are opposing with respect to a plane orthogonal to the direction of implantation;

the first part of the dose is in the range between 25% and 75% of the total dose, preferably equal to 50%, and the second part of the dose is its complement with respect to 100%;

the thin layer of insulator has a thickness in the range between 1 nm and 50 nm, preferably between 15 nm and 25 nm;

the implanted species is hydrogen; and the implantation step comprises a co-implantation of hydrogen and helium.

The disclosure furthermore provides a method for fabrication of a heterostructure of the SOI type comprising a thin layer of insulator sandwiched between a substrate referred to as "receiver" and a thin layer coming from a substrate made of semiconductor material referred to as "donor," the method comprising the steps consisting in:

forming at least one thin layer of insulator on a donor substrate;

forming a fragilization region in the donor substrate by implantation of the donor substrate by applying the implantation method according to this disclosure;

bonding the donor substrate and the receiver substrate so that the layer of insulator is sandwiched between them; and separating the thin layer from the rest of the donor substrate on the fragilization region.

According to one embodiment, the thin layer is separated from the rest of the donor substrate by heat treatment.

According to one embodiment, the heat treatment comprises an increase in temperature to a temperature less than 500° C., and according to a ramp of less than 7° C. per minute, preferably less than 5° C. per minute.

The disclosure also relates to a heterostructure of the SOI type, comprising a thin layer of insulator sandwiched between a thin layer of semiconductor material and a base substrate, the structure being directly obtained by the implementation of the method of fabrication according to this disclosure, and the thin layer of semiconductor material having a variability in thickness of less than 5 Å.

The implementation of the method according to the disclosure allows the uniformity of the depth of implantation of the species into a substrate to be improved, and allows this even when the substrate is only covered by a thin layer of insulator.

BRIEF DESCRIPTION OF THE DRAWINGS

Other features, aims and advantages of this disclosure will become apparent upon reading the detailed description that follows, with reference to the appended figures presented by way of non-limiting examples and in which.

DETAILED DESCRIPTION

The disclosure is implemented during the fabrication of structures of the semiconductor-on-insulator or SOI type, in which a layer of insulator is sandwiched between a thin layer of semiconductor material and a substrate.

The thin layer of semiconductor material has a thickness typically in the range between 50 Å and a few micrometers, for example, of the order of a hundred Angstroms. This is notably the case when the thin layer is used in a product of FDSOI (fully depleted Semiconductor-on-Insulator) type. A possible value of this thickness is 120 Å.

The layer of insulator, also called "BOX," may preferably, but in a non-limiting manner, be a thin layer, then called "UTBOX," with a thickness in the range between 1 nm and 50 nm, preferably between 15 nm and 25 nm. The disclosure may, nevertheless, be applied to thicker BOX layers, for example, of the order of a few hundred nanometers.

Figure 1A:
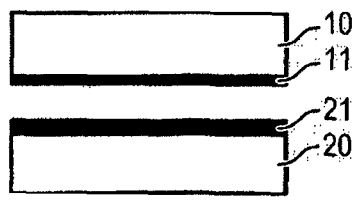
FIGS. 1A through 1D show a fabrication process for an SOI structure during which the method according to the disclosure is implemented.

The process of fabrication of such a structure is shown in FIGS. 1A through 1D. With reference to FIG. 1A, a substrate 10 made of semiconductor material, also called a donor substrate, is provided from which a thin layer, or useful layer 12, of semiconductor material, typically of silicon, will be taken.

The substrate 10 is covered by a thin layer of insulator 11, for example, of silicon oxide $SiO_2$.

The thin layer 12 taken from the donor substrate 10 will be transferred onto another substrate 20, also called a receiver substrate.

Furthermore, the substrate 20 may also be covered with a layer of insulator 21. This layer 21 is, nevertheless, optional because the thin layer of insulator 11 covering the substrate 10 can be sufficient for forming the thin layer of buried oxide.

Figure 1B:
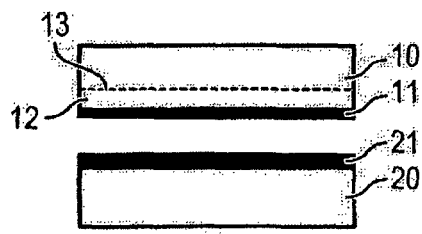

With reference to FIG. 1B, a fragilization region 13 is created within the donor substrate 10, in such a manner as to bound the thin layer of semiconductor material 12 to be transferred between the fragilization region 13 and the layer of insulator 11.

This fragilization is carried out by implantation of ionic or atomic species during a step that is described in more detail hereinafter.

Figure 1C:
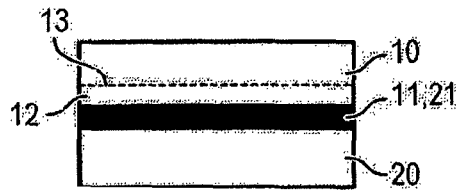

With reference to FIG. 1C, once the fragilization region 13 has been created, the donor substrate 10 is bonded to the receiver substrate 20, so that the layer of insulator 11 on the donor substrate 10 and, where it exists, the layer of insulator 21 on the receiver substrate 20 are sandwiched between the thin layer 12 and the receiver substrate 20.

Figure 1D:
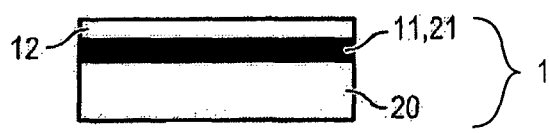

Finally, in FIG. 1D, the back part of the donor substrate 10 is removed by fracturing, in such a manner as to leave only the thin layer of semiconductor material 12 on the layer of insulator 11, 21. At this step, a structure 1 of the SOI type is obtained.

The control of the implantation depth of the species during the implantation step for creating a fragilization region 13 of uniform depth will now be described.

During the implantation step, the species to be implanted are projected toward the substrate 10 with an energy that is predefined depending on the species, so that the latter penetrate inside the substrate to the desired depth, through the thin layer of insulator 11.

The disclosure is preferably implemented by implantation of hydrogen.

However, implanting other species may also be envisaged. For example, a co-implantation of hydrogen and helium, which allows the quality of the final thin layer 12 to be improved, notably by reducing its roughness, may also be used for this step.

In order to carry out the implantation with a controlled implantation depth of the species, a device known as an "implanter" is used, which comprises a system for projection of the species to be implanted, and a support for fixing the substrate or substrates to be implanted, and holding them in the desired position.

The implantation is carried out in "full sheet" mode; in other words, for each substrate, over the whole surface of the substrate.

The species are generally emitted by a source 32, then injected into a particle accelerator 33, selected by a mass analyzer, before being projected onto the wheel 30.

Figure 2:
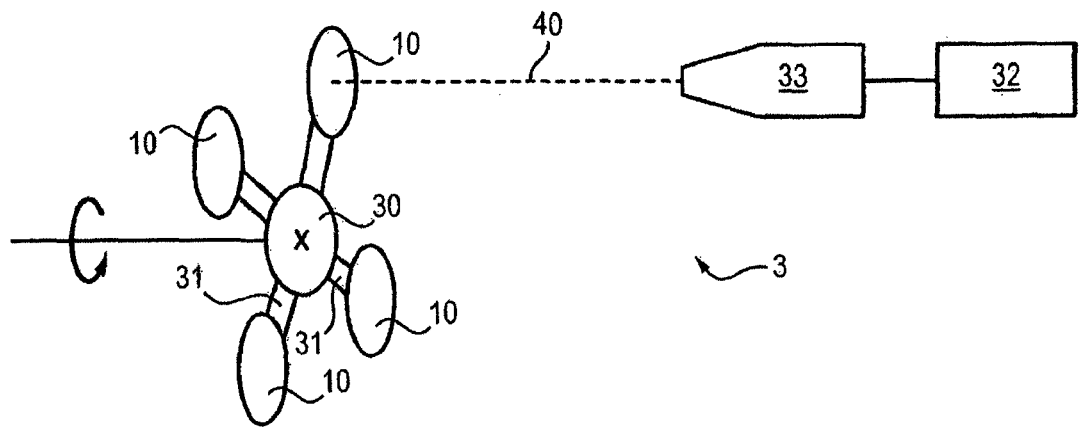
FIG. 2 schematically shows an installation for the implementation of the method according to the disclosure.

The implanter used in the method according to this disclosure is a batch implanter 3. As illustrated in FIG. 2, the implanter 3 comprises a plurality of supports 31 disposed along an outside perimeter of a wheel 30.

Each support 31 can have a surface area and a shape substantially equivalent to the surface area and to the shape of the substrate that it is designed to carry.

Each substrate 10 is positioned on a support 31, and the contact between a substrate 10 and a support 31 is established over essentially the entirety of the surface area of the substrate 10. "Essentially the entirety of the surface area of the substrate 10" is understood to mean a surface area greater than 90%, preferably greater than 95%, even more preferably the totality of the surface area of the substrate 10. The contact between a support 31 and a substrate 10 is designed to stabilize the temperature of the substrate uniformly. "Stabilizing the temperature" of the substrate is taken to mean cooling or heating the substrate.

The wheel 30 is driven in rotation about its axis of symmetry during the implantation step. When the wheel 30 is rotating, the substrates 10 are only held around their outside edge on the supports 31 by fixing means in the shape of a gutter. On this subject, those skilled in the art will find a technical description on the mechanism allowing the substrates 10 to be held on the supports 31 in the document EP 2320454 A1 (T. BESNARD), May 11, 2011 (11.05.2011), column 1, paragraphs [0003] and [0004].

During an implantation, each substrate 10 is exposed to a flux of atomic or ionic species 40 in a constant direction. The flux of implanted species tends to heat up the wafer. In a known manner, for implanting into a batch of substrates 10, the temperature of each substrate 10 is controlled by the support 31 on which it is sitting in order to reduce its temperature. However, the applicant has observed that the temperature is not uniform over the whole surface of the substrates 10. This non-uniformity of the temperature of the substrates 10 is probably due to the at least partial detachment of the substrates 10 from their support 31 during the rotation of the wheel 30. The temperature stabilization of the substrates 10 is then no longer uniform. Consequently, the non-uniformity of the implantation depth of the implanted species is probably due to the non-uniform control of the temperature of the substrates 10.

This effect is not observed in the case of single-wafer implanters. The reason for this is that, in the case of a single-wafer implanter, only one substrate is positioned in the implanter on a support. An electrostatic contact is established between the wafer and the support. The contact between the substrate 10 and its support is, therefore, relatively unaffected. In other words, as there is no detachment between the support and the substrate, the control of the temperature of the substrate is uniform.

During the implantation of the species in a batch implanter 3, each substrate 10 is inclined by tilting each support 31 for a substrate 10 with respect to the direction of implantation of the species.

Figure 3A:
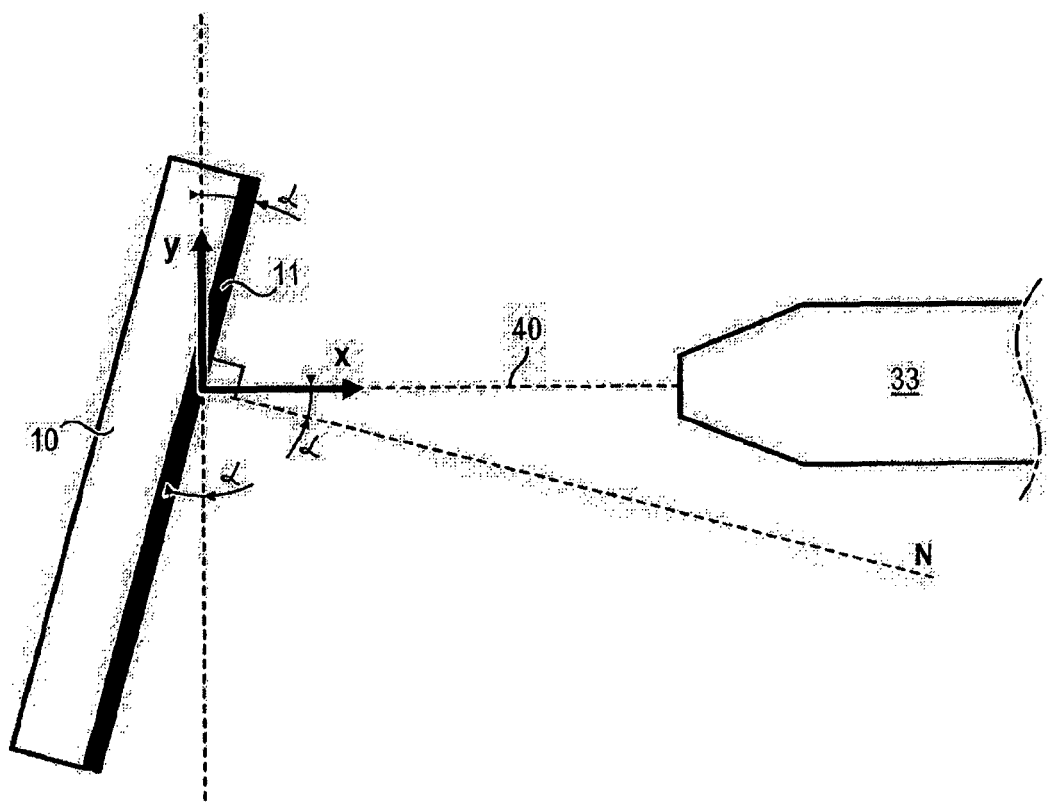
FIG. 3A is a top view of a substrate during implantation, for illustrating notation conventions adopted for the description of the method.

The inclination is illustrated in FIG. 3A, which schematically shows a support 31 exposed to the flux of species, the support being seen from above.

An axis x is defined, parallel to the direction of the flux 40 of implantation of the species, and an axis y, defining with x a direct orthogonal reference frame. Thus, the axis y is included in a plane orthogonal to the direction of implantation.

The support 31, and hence the substrate 10 that is positioned on it, is tilted with respect to the direction of the flux 40 by an angle $\alpha$ with respect to the axis y, in other words to the plane orthogonal to the direction of implantation, such that the flux 40 of implantation of the species is tilted by the angle $\alpha$ with respect to the normal N to the wafer 10.

Advantageously, the tilting of the support 31 may be modified during the implantation step in such a manner that the substrate 10 presents at least two separate inclinations with respect to the direction of implantation of the species during the implantation step.

For example, the implantation step may be implemented in several sub-steps, for example, two sub-steps, between which the tilt, in other words, the value of the angle $\alpha$, is modified.

For example, the tilt can be modified between the sub-steps such that a part of the total dose of species is implanted with a first inclination $\alpha$, and a complementary part of the total dose of species is implanted with an inclination $\alpha'$ different from $\alpha$.

For example, the first part of the dose can be in the range between 25% and 75% of the total dose, preferably 50%, and the second part of the dose is its complement with respect to 100%.

The implantation step may also be divided into three or four sub-steps during which the inclinations are respectively different. The wheel 30 (see FIG. 2) is stopped when the inclination of the substrate supports 31 is changed.

In the case of two sub-steps for which two separate inclinations are applied, the inventors have observed that, surprisingly, the results are better when the inclinations are respectively opposing ($\alpha'=-\alpha$) with respect to the axis y, in other words, with respect to the plane orthogonal to the direction of implantation of the species.

However, a decrease in the thickness variability is also observed even if the inclination $\alpha'$ of the second part of the dose to be implanted is not the opposite of the inclination $\alpha$ of the first part. The absolute values of the inclinations can be different.

Figure 3B:
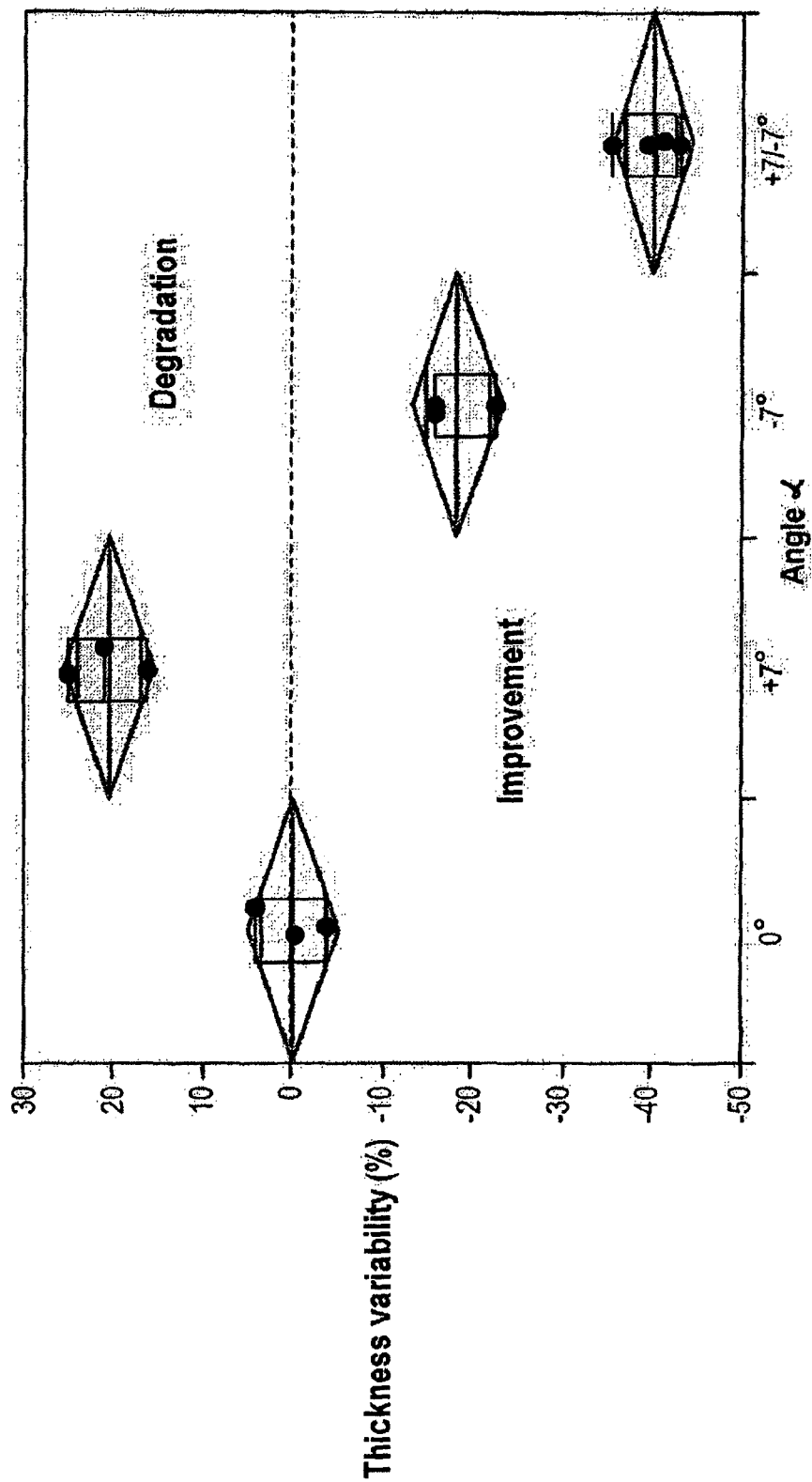
FIG. 3B is a graph presenting results of the application of the method according to the disclosure.

The results of one preferred embodiment of this disclosure are illustrated in FIG. 3B, where the thickness variability of the thin layer 12 (see FIGS. 1B-1D) is shown as a function of the value of the tilt a applied during the implantation. This thickness variability is represented as a percentage of the variability obtained when no tilt is applied to the substrate. Thus, for positive percentages, the thickness variability is increased, and the result is, therefore, degraded. On the other hand, the negative percentages indicate a decrease in the thickness variability and, hence, an improvement in the quality of the surface of the thin layer.

Figure 4:
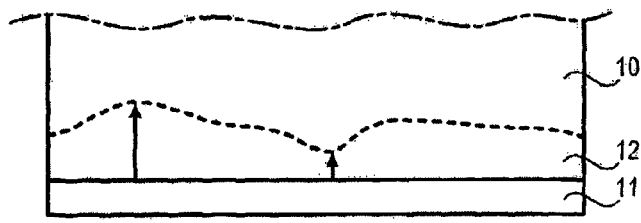
FIG. 4 is a cross-sectional diagram of a substrate implanted by the method according to this disclosure.

The thickness variability is defined with reference to FIG. 4 by the difference in thickness between the point on the layer 12 where the thickness is the greatest, and that where the layer is thinnest.

Again with reference to FIG. 3B, the experimental measurements are indicated by the dots. The mean values M of these measurements are illustrated by the horizontal segments, and the extrema E by the apices of the triangles whose bases are formed by the horizontal segments.

Four series of measurements are illustrated in FIG. 3B, respectively, from left to right: implantation without inclination, implantation with constant inclination equal to 7°, implantation with constant inclination equal to −7°, and implantation whose first half is carried out with an inclination equal to 7°, and the second half with inclination equal to −7°. The other implantation parameters including, in particular, the energy of the implanted species, are the same for these series of measurements.

Figure 3C:
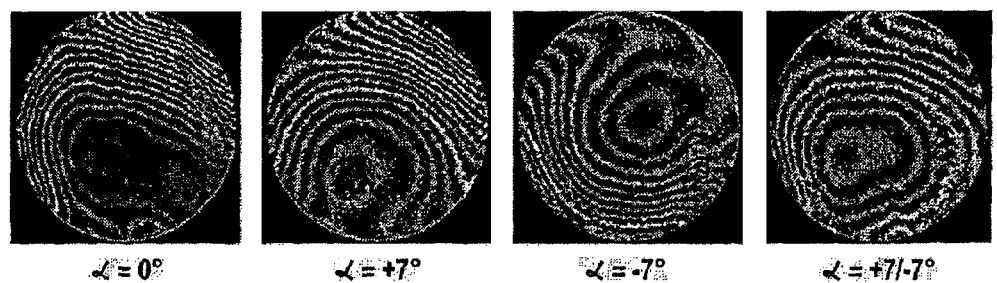
FIG. 3C shows topographies of the thin layer surfaces obtained following the fracturing of the substrate for various implantation angles.

In FIG. 3C, the same experimental results are shown in the same order, this time in the form of topographies of the surface of the thin layer obtained after fracturing.

Conventionally in topography, each contour line shows a particular elevation; the wider a given line, the less the surface exhibits variations in elevations.

Surprisingly, it is observed that the inclination at an angle α of 7° (second illustration starting from the left in FIGS. 3B and 3C) does not allow any beneficial effect to be obtained. This thickness variability is degraded when the substrate is tilted at an angle of 7° by 20% with respect to an inclination of 0°.

In FIG. 3C, an increase in the elevation contour lines is noted, which indicates an increase in the thickness variability of the thin layer 12.

On the other hand, it is observed that the inclination by an angle of −7° allows the thickness variability of the thin layer 12 to be reduced by 15% with respect to the inclination of 0°, as indicated in the third illustration of FIG. 3B. A decrease in the variability in elevation can be seen in FIG. 3C by wider and less numerous elevation contour lines.

Even better results can be seen in FIGS. 3B and 3C, with the successive use of opposing inclinations of absolute value equal to 7°, which allows a decrease in the thickness variability of the thin layer 12 of 40% with respect to the inclination of 0°. The thickness variability obtained is then less than 10 Å and, in this implementation, even less than 5 Å.

The values of the inclination successively at + and −7° are preferred but non-limiting. Indeed, a decrease in the thickness variability has also been observed for absolute values of angles in the range between 2° and 15°, and preferably between 4° and 10°.

Nor is the disclosure limited to the successive use of a positive then negative inclination; the first part of the dose can be implanted with a negative inclination (for example, α=−7°), and the second part of the dose with a positive inclination (for example, α'=+7°).

The implantation step such as implemented in the present disclosure, by directly applying the method for fabrication of an SOI structure such as previously described, allows a hetero structure to be obtained having a thin layer 12 over a buried oxide layer 11, in which the thin layer 12 exhibits a thickness variability that is reduced with respect to the conventional methods of fabrication.

Indeed, the depth of implantation of the species determines the fragilization region 13 of the substrate 10 and, hence, the free surface of the thin layer 12 after its detachment. The improvement in the thickness variability of the thin layer, therefore, results directly from the improvement in the variability of the depth of implantation of the species.

The control of the fracturing step will now be described.

The fracturing step consists of removing the back part of the donor substrate 10 in such a manner as to leave only the thin layer of semiconductor material 12 on the layer of insulator 11, 21, which is executed by a heat treatment step.

The heat treatment step comprises an increase in temperature to a temperature less than 500° C.

In a particularly advantageous manner, the increase in temperature is applied according to a ramp of less than 7° C. per minute, preferably less than 5° C. per minute.

The term "ramp" herein means a rate of rise of temperature.

The applicant has observed the following facts:

The variation in thickness of the thin layer after fracturing is substantially equivalent irrespective of the ramp used during the fracturing step and, according to a method, involving an implantation according to only one inclination. For example, under conditions of implantation according to only one inclination, the variation in thickness of the thin layer after fracturing is substantially equivalent in the case of a ramp at 5° C./minute or 16° C./minute.

In contrast, for a method involving an implantation according to two separate inclinations, the variation in thickness of the thin layer after fracturing is 4.5 Å for a ramp of 5° C./minute, whereas it is 8 Å for a ramp of 16° C./minute.

The effect of the ramp on the variations in thickness of the thin layer after fracturing is very negligible when an implantation step involves only one inclination. On the other hand, the association of an implantation step according to two separate inclinations, and of a ramp of less than 7° C., allows the variations in thickness of the thin layer to be significantly reduced, which is not the case when the ramp is greater than 7° C./minute.

There is evidently a synergy between the mode of implantation and the ramp of the fracturing heat treatment.

The consideration of an implantation according to two separate inclinations combined with a heat treatment comprising an increase in temperature according to a ramp of less than 7° C. per minute results in a greater effect than the sum of the effects taken separately.

In particular, the application of the method according to the disclosure allows a thickness variability of the thin layer of less than 10 Å, or even less than 5 Å, to be obtained.

The invention claimed is:

1. A method for fabrication of a batch of semiconductor-on-insulator (SOI) substrates each having a thin layer of insulator sandwiched between a receiver substrate and a thin semiconductor layer transferred to the receiver substrate from a donor substrate, the method comprising:

forming at least one thin layer of insulator on a surface of each donor substrate of a batch of donor substrates, each donor substrate of the batch of donor substrates including a semiconductor material;

forming a fragilization region in each donor substrate of the batch of donor substrates by implantation of the donor substrates, forming the fragilization region comprising:

positioning each donor substrate of the batch of donor substrates on a respective support of a batch implanter including a plurality of supports, each donor substrate of the batch of donor substrates comprising the at least one thin layer of insulator on the surface of the respective donor substrate;

implanting a dose of at least one ionic or atomic species into the entire surface of each donor substrate of the batch of donor substrates, through the at least one thin layer of insulator, and forming a fragilization region within each donor substrate, and bounding a thin layer of the semiconductor material between the at least one thin layer of insulator and the fragilization region of the respective donor substrate;

wherein each support on which the donor substrate is positioned is inclined at two or more different angles with respect to a plane orthogonal to a direction of implantation of the species during the implantation of the species, wherein each of the two or more angles is in the range extending from 2° to 15° with respect to the plane orthogonal to the direction of implantation;

bonding each of the donor substrates to a respective receiver substrate so that the at least one thin layer of insulator is sandwiched between the respective donor substrate and the respective receiver substrate, wherein the at least one thin layer of insulator has a thickness in the range extending from 1 nm to 50 nm, and separating the thin semiconductor layers from remainders of the respective donor substrates at the fragilization region, wherein the thin semiconductor layers have thicknesses in the range extending from 50 Å and 120 Å.

2. The method of claim 1, wherein separating the thin semiconductor layers from remainders of the respective donor substrates comprises using a heat treatment to separate the thin semiconductor layers from the remainders of the respective donor substrates.

3. The method of claim 2, wherein the heat treatment comprises an increase in temperature to a temperature less than 500° C. at a ramp rate of less than 7° C. per minute.

4. The method of claim 3, wherein the ramp rate is less than 5° C. per minute.

5. The method of claim 1, wherein each of the two or more different angles is in the range extending from 4° to 10°, with respect to the plane orthogonal to the direction of implantation.

6. The method of claim 1, wherein the implanted species comprise hydrogen.

7. The method of claim 6, wherein the implanted species comprise hydrogen and helium.

8. The method of claim 1, wherein, during the implantation of the dose of the at least one ionic or atomic species, a predetermined total dose of ionic or atomic species is implanted, the implantation comprising an implantation of a first part of the total dose while the respective support is oriented at a first angle of the two or more angles, and an implantation of a second part of the total dose while the respective support is oriented at a second angle of the two or more angles.

9. The method of claim 8, wherein the first angle and the second angle are opposing with respect to a plane orthogonal to the direction of implantation.

10. The method of claim 9, wherein the first angle is 7° and the second angle is −7°.

11. The method of claim 9, wherein the first part of the total dose is in the range extending from 25% to 75% of the total dose, and the second part of the total dose is the complement of the first part of the total dose with respect to 100%.

12. The method of claim 11, wherein the first part of the total dose is equal to 50%.

13. The method of claim 1, wherein the at least one thin layer of insulator has a thickness in the range extending from 5 nm to 25 nm.

* * * * *